United States Patent [19]

Grellman et al.

[11] Patent Number: 4,600,907

[45] Date of Patent: Jul. 15, 1986

[54] COPLANAR MICROSTRAP WAVEGUIDE INTERCONNECTOR AND METHOD OF INTERCONNECTION

[75] Inventors: H. Erwin Grellman, Beaverton; Carl W. Laakso, Portland; John J. Reagan, Beaverton; Leonard A. Roland, Portland, all of Oreg.

[73] Assignee: Tektronix, Inc., Beaverton, Oreg.

[21] Appl. No.: 709,463

[22] Filed: Mar. 7, 1985

[51] Int. Cl.$^4$ .............................................. H01P 1/04
[52] U.S. Cl. ..................... 333/246; 333/260; 29/835; 29/839; 29/843
[58] Field of Search ............... 333/33, 238, 246, 247, 333/260; 29/832, 835, 839, 840, 842, 843, 860

[56] References Cited

U.S. PATENT DOCUMENTS

| | | | |
|---|---|---|---|
| 3,398,232 | 8/1968 | Hoffman | 333/238 X |
| 3,560,893 | 2/1971 | Wen | 333/238 X |
| 3,848,198 | 11/1974 | De Brecht et al. | 333/238 X |
| 3,975,690 | 8/1976 | Fleming | 333/246 X |
| 4,386,324 | 5/1983 | Schllenberg | 333/238 X |
| 4,460,880 | 7/1984 | Turner | 333/33 X |

FOREIGN PATENT DOCUMENTS 557003  5/1958  Canada ............................ 333/238

Primary Examiner—Eugene R. LaRoche
Assistant Examiner—Benny Lee
Attorney, Agent, or Firm—Francis I. Gray; William O. Geny

[57] ABSTRACT

An electrical connection between two semiconductor devices employs a coplanar microstrap waveguide comprising a plurality of thin straps of conductive metal embedded in a polyimide substrate and dimensioned to exhibit the properties of a coplanar waveguide. The waveguide structure provides the proper impedance matching between the two devices and enables them to handle signals having frequencies in the gigahertz range.

10 Claims, 3 Drawing Figures

COPLANAR MICROSTRAP WAVEGUIDE INTERCONNECTOR AND METHOD OF INTERCONNECTION

BACKGROUND OF THE INVENTION

The following invention relates to a method and apparatus for connecting two semiconductor devices together or for connecting a semiconductor device to a passive circuit by means of a coplanar waveguide that is free from inductive reactance at high frequencies.

Small integrated circuit elements such as microprocessors are typically connected to other larger semiconductor devices such as hybrid integrated circuits by wire bonding. The wire bonding technique utilizes a special machine to fuse extremely small diameter wires to the contact points or bond pads of these smaller IC chips. This method of physical interconnection of one semiconductor device to another is adequate where the upper limit of the frequency of the signal between the devices is less than 10 megahertz. At frequencies of around 100 megahertz, however, the bond wire begins to behave as an inductor inducing a reactive component in the connection that attenuates the signal level. This attenuation takes the form of a subtraction effect that occurs when a certain portion of the input frequency wave is reflected back to the source from the wire bond connection. At frequencies in the gigahertz range, the wire bond becomes an almost pure inductance which severely retards the incoming signal, and at a range of 10 to 30 gigahertz there may be complete attenuation.

In hybrid IC chips, that is relatively large chips which include a ceramic substrate, high-frequency RF signals, are transmitted via a transmission line imprinted on the chip. Such transmission lines are described generally in a text, Gupta, Garg, and Bahl "Microstrip Lines and Slotlines" (Artech House, Inc., 1979). The transmission line on such circuits may take the form of a coplanar wave guide which includes a signal-carrying conductor flanked on opposite sides by a pair of ground plane conductors. All of the conductors extend substantially parallel to one another and are coplanar. It is at the interface between the transmission line of the hybrid IC chip and a smaller integrated circuit usually referred to as a die that the bond wire connection described above is made. The transmission line of the hybrid IC is fully capable of handling frequencies in the gigahertz range but the inductive problem described above is encountered when attempting to connect the IC die to the hybrid IC transmission line.

SUMMARY OF THE INVENTION

The inductive problem posed by wire bond connections is solved in the present invention by providing a continuation of the transmission line of the hybrid IC in a configuration that essentially preserves the predetermined impedance of the transmission line. Thus the impedance remains constant from medium to medium and does not result in any attenuation of the signal due to inductive loading at the connection between the hybrid IC and the smaller IC die.

According to the invention, three thin metallic straps supported by a dielectric substrate are pressure-bonded to respective electrical contact points on the hybrid IC and the IC die. The three straps, which lie in the same horizontal plane, form a continuation of the transmission line of the hybrid IC. The center strap is a signal-carrying conductor and the straps on either side of the center strap form a ground plane. The straps are formed on a polyimide substrate which is a planar sheet of dielectric material. The straps are, in addition, embedded in the polyimide sheet so that the gap width between each of the straps is substantially filled with dielectric material.

The individual widths of the connecting straps are such that the outer straps may function as a ground plane. Typically the signal-carrying strap has a width of approximately 2.5 mils and the outer straps have a width of 6 mils. With these widths it is possible to calculate the overall impedance of the microstrap waveguide. This impedance is equal to the square root of the ratio of inductance to capacitance. Once the impedance is known, it is possible to adjust the capacitance of the microstrap waveguide by adjusting the gap spacing between the signal-carrying central line and the two adjacent flanking ground plane lines. Since the gap is substantially filled with a dielectric material, these lines provide a capacitive reactance to an incoming signal which may be adjusted by dimensioning the gap within tolerances achievable by existing machinery used for such purposes.

The actual physical connection between the two semiconductor devices is made by first cutting the polyimide substrate containing the microstrap connection to the required length and width and pressure bonding the ends of the microstraps to the respective electrical terminals on the hybrid IC and the IC die.

It is a primary object of this invention to provide an electrical connection between two semiconducting devices capable of handling extremely high-frequency signals with little or no signal attenuation.

A further object of this invention is to provide a coplanar wave guide-connecting link between two semiconducting devices which may be bonded to each semiconducting device using conventional pressure-bonding techniques.

Yet a further object of this invention is to provide a connecting link between two semiconducting devices which overcomes the problem of inductive reactance caused by previous wire bonding techniques.

Yet a further object of this invention is to provide a coplanar wave guide transmission link between a hybrid IC chip and an IC die in which the transmission link has an impedance matching that of the impedance of the hybrid IC.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
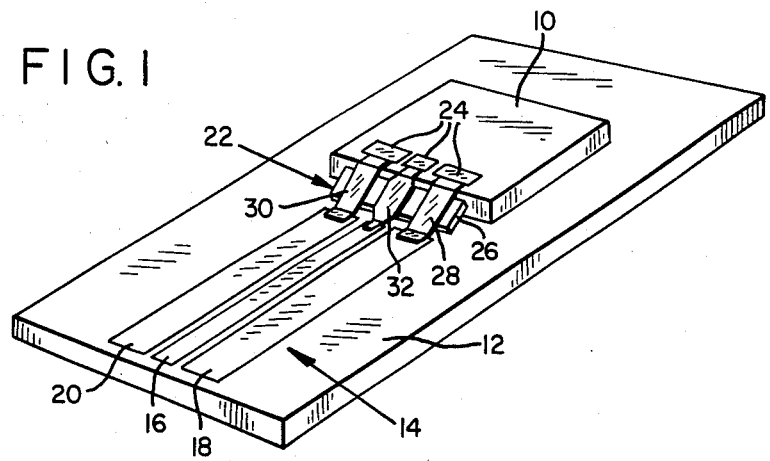
FIG. 1 is a perspective view of a coplanar wave guide microstrap connecting a hybrid to an IC die.

An integrated circuit chip 10, hereinafter referred to as a "die" is physically mounted and affixed to a hybrid integrated circuit 12. The hybrid circuit 12 has imprinted on its surface a coplanar waveguide 14 comprising a signal-carrying strip 16 and adjacent ground plane strips 18 and 20. A coplanar microstrap waveguide 22 forms the electrical connection between the ends of coplanar waveguide 14 and electrical terminal points 24 on the die 10.

Figure 2:
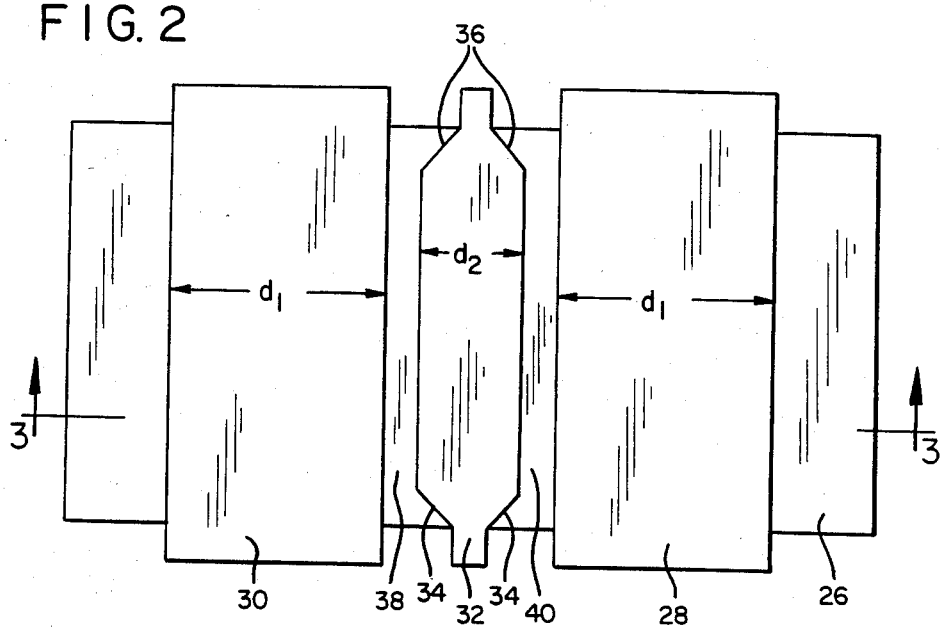
FIG. 2 is a top view of the connection of FIG. 1.
Figure 3:
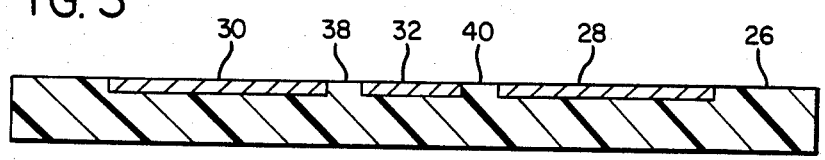
FIG. 3 is a cutaway view taken along line 3—3 of FIG. 2.

The structure of the coplanar microstrap waveguide 22 is shown in more detail in FIGS. 2 and 3. A substrate 26 formed of a thin dielectric material such as polyimide forms a support base for three coplanar straps 28, 30 and 32 oriented substantially parallel to one another on the substrate 26. Ground plane straps 28 and 30 are disposed one on either side of a central signal-carrying strap 32. The signal-carrying strap has mitered ends 34 and 36 whose function will be explained below.

As shown in FIG. 3, the signal-carrying strap 32 and each of the ground plane straps 28 and 30, respectively, are substantially embedded in polyimide substrate 26. Embedding the straps in this manner causes the spacings 38 and 40 between adjacent pairs of straps 30 and 32, and 32 and 28, respectively, to be substantially occupied by the dielectric material of substrate 26.

Each of the ground plane straps 30 and 28 has a predetermined width designated as d1 in FIG. 2. The signal-carrying strap likewise has a predetermined width exclusive of the mitered ends and is designated as d2 in FIG. 2. The dimension d1 of the ground plane straps 30 and 28 need only be wider than a minimum value in order for the straps to function as true ground planes. Thus d1 could be made wider if desired. In the preferred embodiment, the dimension d2 is 2.5 mils and the dimension d1 is 6 mils. Thus, d1 could be wider than 6 mils but this would confer no appreciable benefit on the configuration since a 6-mil width is sufficient to cause straps 30 and 28 to function as a ground plane for 2.5-mil-wide signal-carrying strap 32. The spacings between adjacent straps 38 and 40 are 0.5 mil each in the preferred embodiment. The presence of a dielectric material in spacings 38 and 40 permits the spacing to be wider than that which would otherwise be permitted. For example, if air were used as a dielectric, the adjacent spacings between the straps would have to be on the order of 0.17 mil which is a difficult tolerance to maintain with conventional manufacturing processes.

The coplanar waveguide microstrap is a continuation of the coplanar waveguide 14 imprinted on hybrid circuit 12. As such, it is intended to have the same impedance as coplanar waveguide 14 which is usually on the order of 50 ohms.

The impedance of any coplanar waveguide is determined by the formula $Z_O = \sqrt{L/C}$ where $Z_O$ is the impedance of the waveguide, L is the inductance and C is the capacitance. The impedance of a coplanar waveguide structure thus depends upon the capacitance between the conductors 28, 30 and 32 which, in turn, depends upon the dielectric constant of the substrate material, the dimensions of the microstraps, and the spacing or gap between the center signal-carrying conductor and the two ground plane conductors.

In the preferred embodiment it is desirable to make the center or signal carrying strap 32 as small as possible so that it may be physically bonded to the connection terminals 24 of the IC die 10. These terminals are designed primarily for wire bonding and therefore the dimensions of the strap should, if possible, at least attempt to approach the dimensions of the wire with which the connection terminal was intended to be used. A practical limit which is inherent in the manufacturing process for microstraps of the type discussed herein is on the order of 2.5 mils.

As shown in FIG. 3 the microstraps 28, 30 and 32 are substantially embedded in the dielectric substrate 26. A thin top surface may protrude above the substrate 26 but it is preferred that the microstraps 28, 30 and 32 be flush with the top of substrate 26. Thus, the gaps 38 and 40 are substantially filled with dielectric material. The thickness of each of the micro straps 28, 30 and 32 should be as small as possible but again the practical limits of conductor thickness dictate that the lower limit for such thickness is approximately 8 microns ±2 microns.

Knowing the dimensions of the microstraps and assuming that the dielectric material of the polyimide substrate substantially fills the adjacent spacing between microstraps, the impedance of the coplanar waveguide thus formed may be determined by reference to the text entitled "Microstrip Lines and Slotlines" Gupta, Garg and Bahl (Artech House, Inc., 1979), pages 257–267, which is incorporated herein by reference. Using the Gupta text, for any desired impedance, the gap spacing between adjacent microstraps may be determined and accordingly adjusted. As mentioned previously, the normal impedance of a coplanar waveguide impressed upon a hybrid IC is usually 50 ohms. This dictates the result that in the preferred embodiment with its given parameters the gap spacings 38 and 40 should be 0.5 mil each.

As shown in FIG. 2 the conductors overlap the substrate enough to allow physical bonding of the ends to the hybrid IC 12 and the IC die 10. In order to reduce stray capacitance at each end, signal-carrying strap 32 includes mitered ends 34 and 36. This keeps the impedance of the coplanar waveguide 14 substantially constant over its entire length.

In order to form the coplanar waveguide microstrap 22, predimensioned thin straps of a predetermined length, made preferably of gold or a noble metal, are embedded in a sheet of polyimide having a predetermined length. The straps overlap the ends of the sheet which is then trimmed to remove excess material. The ends of the microstraps 28, 30 and 32 are then pressure bonded to respective electrical terminal points on the IC die 10 and on the hybrid IC 12. A conventional pressure bonding machine may be used for this step, an example of which is a Kulicke Soffa Model No. 4010 Wedge Bonder from the Kulicke Soffa Co. of Horsham, Penna.

Although gold is preferred for making the microstraps, other metals having high conductivity such as silver, copper or aluminum may also be used.

The terms and expressions which have been employed in the foregoing specification are used therein as terms of description and not of limitation, and there is no intention of the use of such terms and expressions excluding equivalents of the features shown and described or portions thereof, it being recognized that the scope of the invention is defined and limited only by the claims which follow.

We claim:

1. A high frequency electrical connector for interconnecting a pair of electrical devices comprising a plurality of substantially parallel coplanar metallic straps supported by a dielectric substrate including at least one signal-carrying strap and adjacent ground plane straps disposed one on either side of the signal-carrying strap so as to form spacings of a predetermined width between the signal-carrying strap and each of the ground plane straps, the ends of each of said straps extending beyond the edges of said dielectric substrate to provide contact points for interconnection between said electrical devices.

2. The connector of claim 1 wherein the signal-carrying strap has mitered ends.

3. The connector of claim 1 wherein the straps are embedded in the dielectric substrate such that the adjacent spacing between any two straps is substantially occupied by the dielectric substrate.

4. The connector of claim 1 wherein the straps are formed of gold.

5. The connector of claim 3 wherein the predetermined width between adjacent straps is chosen to provide a predetermined impedance for said electrical connector which matches the impedance of at least one of the electrical devices.

6. A method of connecting two electrical devices together comprising the steps of:
   (a) forming on a dielectric substrate three substantially parallel metallic conducting straps of respective predetermined widths, said straps having predetermined spacings therebetween so as to form a coplanar waveguide having a center signal-carrying strap and two adjacent ground plane straps;
   (b) cutting said substrate and metallic straps, each being cut to a predetermined length and width so that the ends of said straps extend beyond the edges of said substrate; and
   (c) pressure-bonding the ends of said metallic straps to respective electrical terminal points on each of said electrical devices, respectively, to form an electrical connection between the two devices.

7. The method of claim 6, further including the step of embedding the metallic straps in the substrate so that the dielectric material substantially fills the spacings between adjacent straps.

8. The method of claim 6, wherein each of said metallic straps are formed of gold.

9. The method of claim 6, wherein the forming step first includes the step of determining the impedance of the coplanar waveguide as a function of the spacings between adjacent straps and adjusting said spacings to provide said predetermined spacings so that the impedance for the waveguide substantially matches the impedance of at least one of the electrical devices.

10. The method of claim 6, further including the step of mitering the ends of the center signal-carrying strap.

* * * * *